(12) United States Patent
Jain

(10) Patent No.: US 9,607,926 B2
(45) Date of Patent: Mar. 28, 2017

(54) PROBE PAD DESIGN TO REDUCE SAW DEFECTS

(71) Applicant: Texas Instruments Incorporated, Dallas, TX (US)

(72) Inventor: Manoj Jain, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 22 days.

(21) Appl. No.: 14/563,085

(22) Filed: Dec. 8, 2014

(65) Prior Publication Data

US 2015/0170983 A1 Jun. 18, 2015

Related U.S. Application Data

(60) Provisional application No. 61/915,187, filed on Dec. 12, 2013.

(51) Int. Cl.
*H01L 21/66* (2006.01)
*H01L 23/48* (2006.01)

(52) U.S. Cl.
CPC ............ *H01L 23/481* (2013.01); *H01L 22/34* (2013.01); *H01L 2924/0002* (2013.01)

(58) Field of Classification Search
CPC ....... H01L 22/34; H01L 23/481; H01L 22/00; H01L 22/10; H01L 22/22; H01L 22/30; H01L 22/32; H01L 23/48; H01L 23/4824; H01L 23/50; H01L 23/52; H01L 23/522; H01L 23/3114; H01L 21/768; H01L 21/76897

See application file for complete search history.

(56) References Cited

U.S. PATENT DOCUMENTS

| | | | | |
|---|---|---|---|---|
| 6,165,880 A | * | 12/2000 | Yaung | H01L 21/28525 257/E21.166 |
| 6,340,823 B1 | * | 1/2002 | Kitade | G01R 31/2884 257/275 |
| 2012/0012843 A1 | * | 1/2012 | Matsubara | H01L 22/34 257/48 |

* cited by examiner

*Primary Examiner* — John C Ingham
*Assistant Examiner* — Gustavo Ramallo
(74) *Attorney, Agent, or Firm* — Jacqueline J. Garner; Charles A. Brill; Frank D. Cimino

(57) ABSTRACT

An integrated circuit wafer and fabrication method includes a probe pad structure in saw lanes between integrated circuits. The probe pad structure includes a probe pad with a plurality of pad segments. The pad segments are elements of an interconnect level of the wafer.

17 Claims, 17 Drawing Sheets

PROBE PAD DESIGN TO REDUCE SAW DEFECTS

CROSS-REFERENCE TO RELATED APPLICATIONS

This application claims the benefit of priority under U.S.C. §119(e) of U.S. Provisional Application No. 61/915,187, filed Dec. 12, 2013, which is hereby incorporated by reference in its entirety.

FIELD OF THE INVENTION

This invention relates to the field of integrated circuits. More particularly, this invention relates to metallization layers in integrated circuits.

BACKGROUND OF THE INVENTION

Semiconductor wafers containing integrated circuits separated by saw lanes may have metalized structures such as test components in the saw lanes. The metallized structures may include interconnect leads and probe pads in dielectric layers. During a saw process which separates the integrated circuits, metal from the metalized structures may cause short circuit defects at edges of the integrated circuits. Cracks and chips in the dielectric layers resulting from the sawing process may also cause defects at the edges of the integrated circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor wafer and fabrication method comprises a first integrated circuit, a second integrated circuit disposed adjacent to the first integrated circuit, and a saw lane disposed between the first integrated circuit and the second integrated circuit. A probe pad structure is disposed in the saw lane. The probe pad structure includes a plurality of pad segments forming a segmented probe pad in an interconnect level of the wafer.

DETAILED DESCRIPTION OF EXAMPLE EMBODIMENTS

Figure 1:
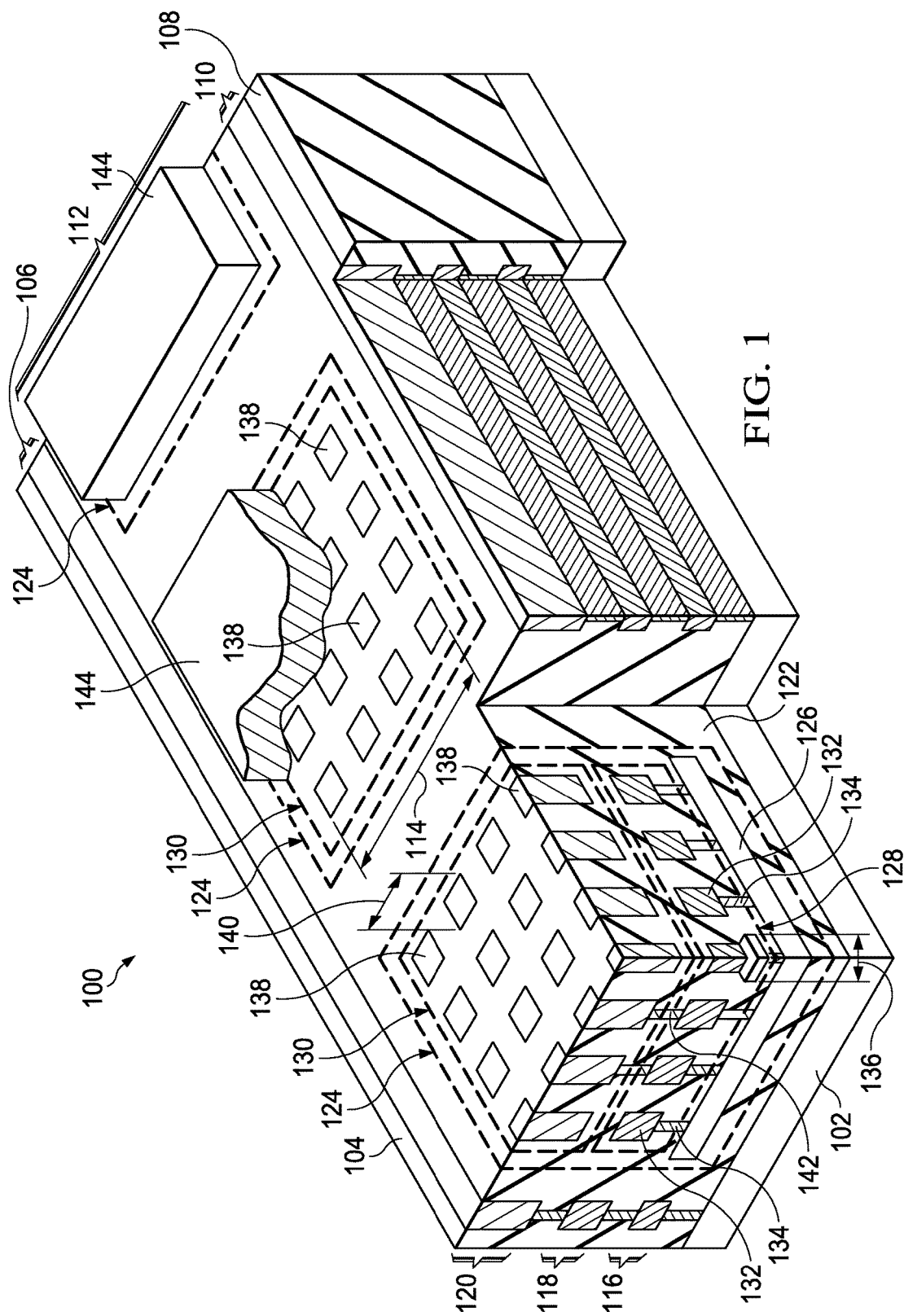
FIG. 1 is a cross section of an integrated circuit wafer with a saw lane containing a plurality of probe pad structures formed according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit wafer may be formed by a process which includes forming test structures in saw lanes between integrated circuits in the wafer. The test structures may include a plurality of probe pad structures formed of metal interconnects. Each probe pad structure includes at least one probe pad formed of metal interconnect elements concurrently with an interconnect level of the adjacent integrated circuits. The probe pad structures may include as many probe pads as there are interconnect levels in the integrated circuits, with the probe pads formed so as to be electrically connected in series to at least one instance of the test structures. A plurality of the probe pad structures may be formed so that at least one of the probe pads in each probe pad structure includes pad segments of which a maximum lateral dimension of each segment is up to 75 percent of a width of the probe pad containing the pad segments. The probe pads including the pad segments are further free of instances of metal interconnect elements of the same interconnect level as the pad segments which have a lateral dimension longer than 75 percent of the width of the probe pad.

For the purposes of this description, the term "lateral" will be understood to refer to a direction parallel to a top surface of a semiconductor wafer.

FIG. 1 is a cross section of an integrated circuit wafer with a saw lane containing a plurality of probe pad structures 124 formed according to an embodiment. The integrated circuit wafer 100 includes a semiconductor substrate 102 which may be, for example, a single crystal silicon wafer, a silicon-on-insulator (SOI) wafer, a hybrid orientation technology (HOT) wafer with regions of different crystal orientations, or other semiconductor material appropriate for fabrication of integrated circuits. The wafer 100 includes a first integrated circuit 104 formed in and on the substrate 102; only a portion of the integrated circuit 104 is shown in FIG. 1. The first integrated circuit 104 may include an optional first scribe seal 106 which includes elements of interconnect metal surrounding the first integrated circuit 104. The wafer 100 also includes an adjacent second integrated circuit 108 which may also include an optional second scribe seal 110. A saw lane 112 is disposed in the wafer 100 between the first integrated circuit 104 and the second integrated circuit 108. The first and second integrated circuits 104 and 108 include metal interconnect levels, for example, a first interconnect level 116, a second interconnect level 118 and a third interconnect level 120. The metal interconnect levels 116, 118 and 120 are disposed in layers of dielectric material 122, possibly including layers of, for example, silicon dioxide, phosphosilicate glass (PSG), boron phosphosilicate glass (BPSG), silicon nitride, silicon oxynitride, silicon carbide, silicon carbide nitride, silicon oxy carbide nitride, organosilicate glass (OSG), carbon-doped silicon oxides (SiCO or CDO), and/or methylsilsesquioxane (MSQ).

The saw lane 112 contains a plurality of probe pad structures 124. Each instance of the probe pad structures 124 includes an unsegmented first probe pad 126 of the first interconnect level 116, a segmented second probe pad 128 of the second interconnect level 118 and a segmented third probe pad 130 of the third interconnect level 120. The unsegmented first probe pad 126 does not include pad segments. The second probe pad 128 includes a plurality of pad segments 132. The third probe pad 130 includes a plurality of pad segments 138.

A width of a probe pad is defined as a widest lateral distance between edges of pad segments in the probe pad, in a direction perpendicular to a boundary of the first integrated circuit 104 abutting the saw lane 112 and a boundary of the second integrated circuit 108 abutting the saw lane 112, adjacent to the probe pad. For example, a width 114 of the third probe pad 130 is a widest lateral distance between edges of the pad segments 138 in the third probe pad 130, such that the probe pad width 114 is perpendicular to the boundary of the first integrated circuit 104 abutting the saw lane 112 and the boundary of the second integrated circuit 108 abutting the saw lane 112, adjacent to the third probe pad 130.

Each instance of the pad segments 132 in the second probe pad 128 has a maximum lateral dimension 136 which is up to 75 percent of the probe pad width 114. The second probe pad 128 is free of instances of metal interconnect elements of the second interconnect level 118 which have a maximum lateral dimension greater than 75 percent of the probe pad width 114. In one version of the instant embodiment, the maximum lateral dimension 136 of each instance of the pad segments 132 in the second probe pad 128 is up to 50 percent of the probe pad width 114, and the second probe pad 128 is free of instances of metal interconnect elements of the second interconnect level 118 which have a maximum lateral dimension greater than 50 percent of the probe pad width 114. In a further version, the maximum lateral dimension 136 of each instance of the pad segments 132 in the second probe pad 128 is up to 25 percent of the probe pad width 114, and the second probe pad 128 is free of instances of metal interconnect elements of the second interconnect level 118 which have a maximum lateral dimension greater than 25 percent of the probe pad width 114. At least a portion of the pad segments 132 of the second probe pad 128 are electrically connected to the first probe pad 126 by at least one instance of vias 134 between the first interconnect level 116 and the second interconnect level 118.

Each instance of the pad segments 138 of the third probe pad 130 has a maximum lateral dimension 140 which is up to 75 percent of the probe pad width 114. The third probe pad 130 is free of instances of metal interconnect elements of the third interconnect level 120 which have a maximum lateral dimension 140 greater than 75 percent of the probe pad width 114. In one version of the instant embodiment, the maximum lateral dimension 140 of each instance of the pad segments 138 in the third probe pad 130 is up to 50 percent of the probe pad width 114, and the third probe pad 130 is free of instances of metal interconnect elements of the third interconnect level 120 which have a maximum lateral dimension greater than 50 percent of the probe pad width 114. In a further version, the maximum lateral dimension 140 of each instance of the pad segments 138 in the third probe pad 130 is up to 25 percent of the probe pad width 114, and the third probe pad 130 is free of instances of metal interconnect elements of the third interconnect level 120 which have a maximum lateral dimension greater than 25 percent of the probe pad width 114. At least a portion of the pad segments 138 of the third probe pad 130 are electrically connected to the second probe pad 128 by at least one instance of vias 142 between the second interconnect level 118 and the third interconnect level 120.

In one version of the instant embodiment, the second probe pad 128 and the third probe pad 130 may be 45 microns wide in each lateral direction, that is in directions perpendicular to, and parallel to, the boundary of the first and second integrated circuits 104 and 108 abutting the saw lane 112 adjacent to the probe pads 128 and 130. The pad segments 132 and 138 of the second and third probe pads 128 and 130 may have lateral dimensions of 1.5 to 2.5 microns. In another version, the second probe pad 128 and the third probe pad 130 may be 80 microns wide in each lateral direction.

Surface pads 144 may be disposed on the top probe pads 130 in the probe pad structures 124, for example, wirebond pads or bump pads. The surface pads 144 are not part of an interconnect level of the wafer 100. Portions of the surface pads 144 have been removed in FIG. 1 to illustrate the configuration of the pad segments 138 in the third probe pad 130.

Figure 2A:
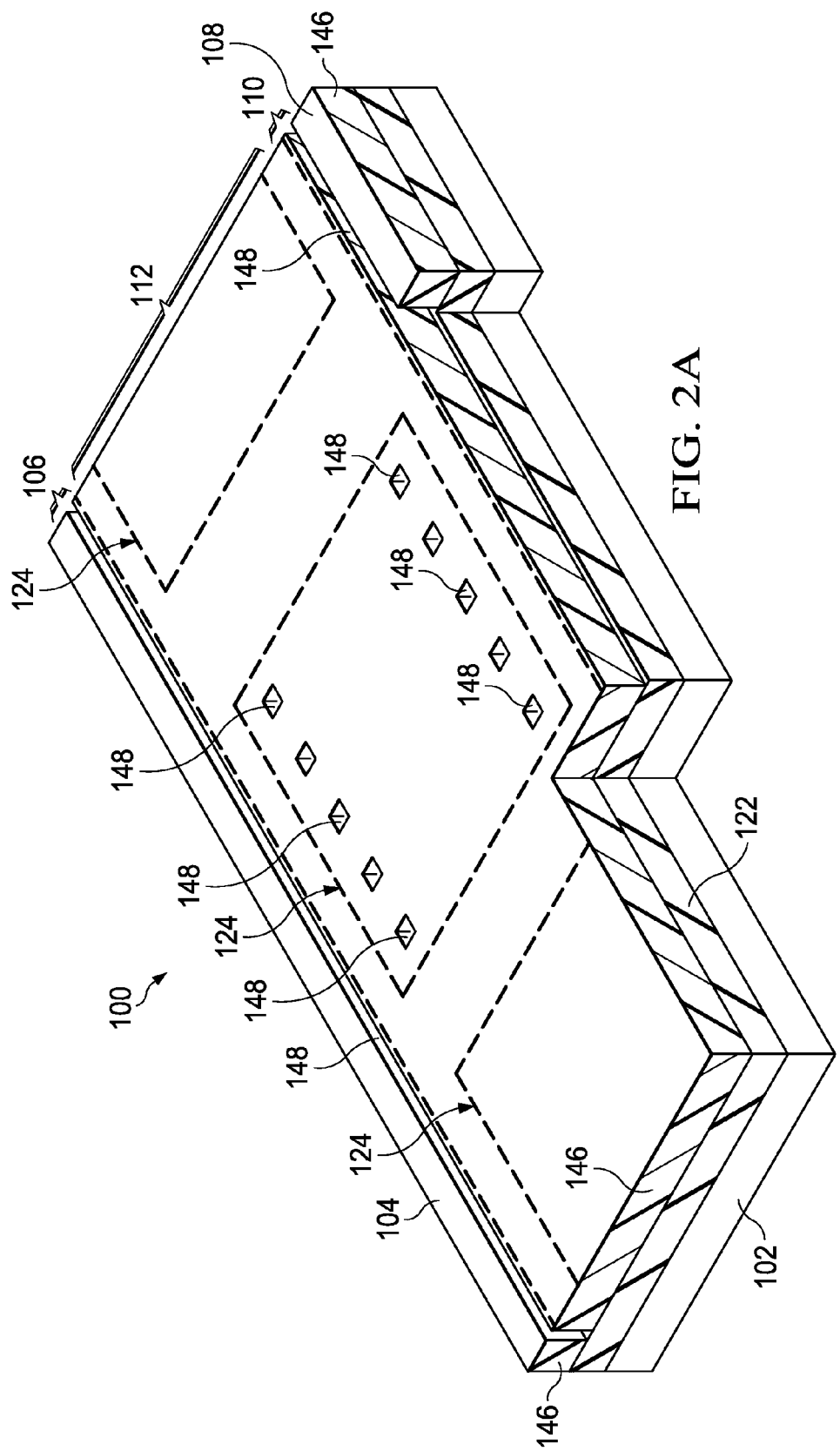
FIG. 2A through FIG. 2I are cross sections of an integrated circuit wafer with a saw lane containing a plurality of probe pad structures formed according to the embodiment of FIG. 1, depicted in successive stages of fabrication.

FIG. 2A through FIG. 2I are cross sections of an integrated circuit wafer with a saw lane containing a plurality of probe pad structures formed according to the embodiment of FIG. 1, depicted in successive stages of fabrication. Referring to FIG. 2A, the wafer 100 includes the semiconductor substrate 102 as described in reference to FIG. 1. The wafer 100 includes the first integrated circuit 104, possibly including include the optional first scribe seal 106, and the adjacent second integrated circuit 108 with the optional second scribe seal 110, as described in reference to FIG. 1. The saw lane 112 is disposed in the wafer 100 between the first integrated circuit 104 and the second integrated circuit 108. Areas for the probe pad structures 124 are defined in the saw lane 112.

Formation of the stack of dielectric layers 122 begins with formation of a pre-metal dielectric (PMD) layer over the substrate 102. The PMD layer is a dielectric layer stack possibly including an optional PMD liner, not shown, a PMD main layer, and an optional PMD cap layer, not shown. The PMD liner is commonly silicon nitride or silicon dioxide, 10 to 100 nanometers thick, deposited by a plasma enhanced chemical vapor deposition (PECVD) on the existing top surface of the integrated circuit 100. The PMD main layer is commonly a layer of silicon dioxide formed by a HARP process followed by a layer of silicon dioxide, PSG or BPSG, commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

A contact etch mask 146 is formed over the existing dielectric layer stack 122 so as to expose areas 148 for etching contact holes in the first integrated circuit 104, in the second integrated circuit 108, and in the saw lane 112, and possibly scribe seal lines in the scribe seals 106 and 110. The contact etch mask 146 may include, for example, photoresist and/or dielectric hard mask layers such as silicon nitride, silicon carbide or silicon carbide nitride. The contact etch mask 146 may be formed, for example, by photolithographic processes and possibly a hard mask etch process.

A contact etch process is performed on the wafer 100 which removes material from the existing dielectric layer stack 122 in the contact holes and scribe seal lines exposed by the contact etch mask 146 of FIG. 2A. The contact etch mask 146 is removed after the contact etch process is completed. The contact holes and scribe seal lines are filled with contact metal, for example, a liner of titanium and titanium nitride and a fill metal of tungsten. The liner may be formed by metal organic chemical vapor deposition (MOCVD) and atomic layer deposition (ALD) processes, and the fill metal may be formed by a chemical vapor deposition (CVD) process. A subsequent etchback process and/or CMP process may remove fill metal and liner metal from an existing top surface of the dielectric layer stack 122.

Figure 2B:
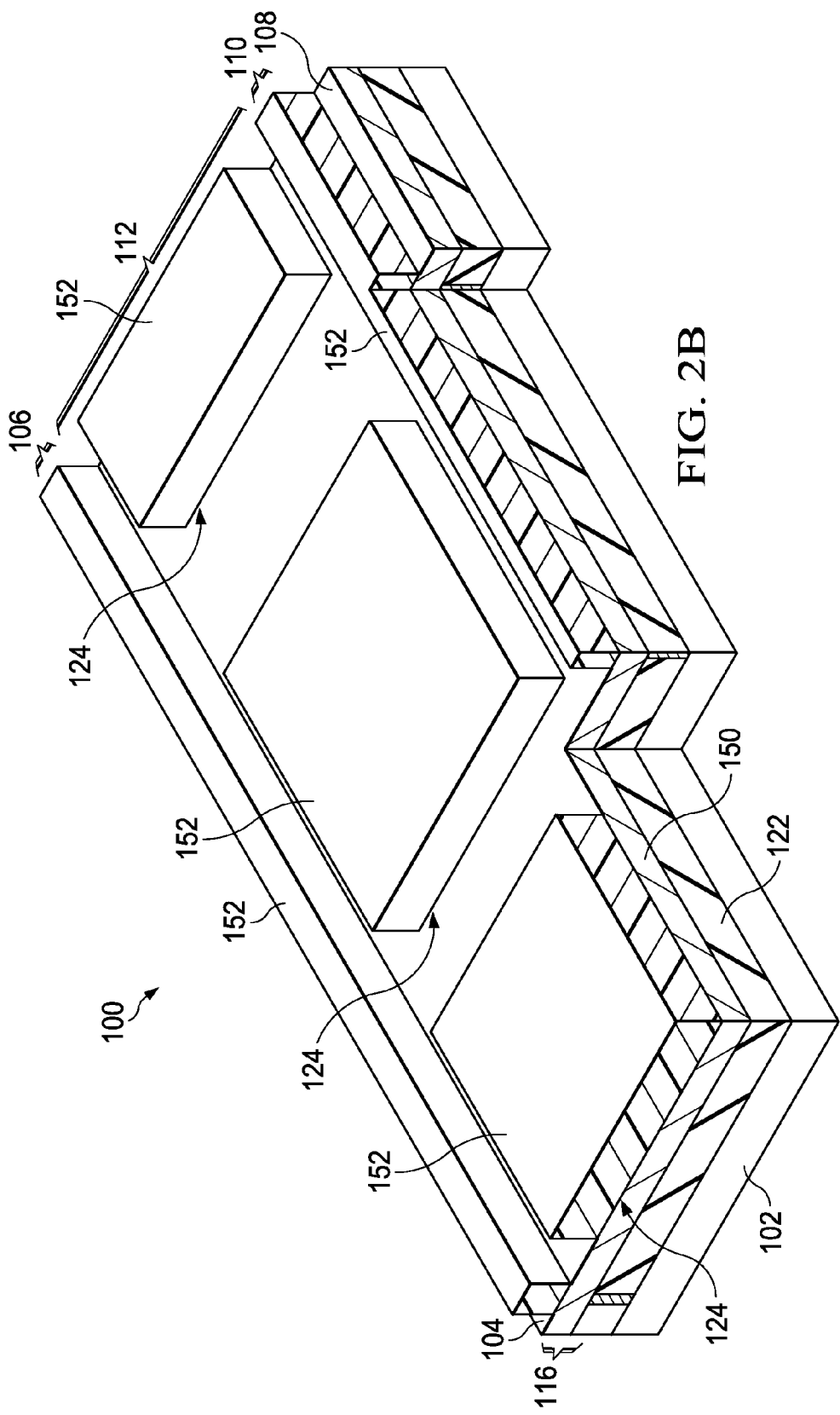

Referring to FIG. 2B, a first interconnect metal layer 150, for example a layer stack including an adhesion layer of titanium, titanium tungsten or titanium nitride 5 to 20 nanometers thick, a main layer of aluminum or aluminum alloy 100 to 250 nanometers thick, and a cap layer of titanium nitride 5 to 20 nanometers thick, is formed over the existing dielectric layer stack 122. The first interconnect metal layer 150 may be formed, for example, by a combination of MOCVD, ALD, and sputtering.

A first interconnect etch mask 152 is formed over the first interconnect metal layer 150 so as to define areas for elements of the first interconnect level 116 of FIG. 1. The first interconnect etch mask 152 may include, for example, photoresist and be formed, for example, by a photolithographic process. The first interconnect etch mask 152 covers areas for the unsegmented first probe pads 126 of FIG. 1 and scribe seal lines in the scribe seals 106 and 108, and interconnect lines, not shown, in the first and second integrated circuits 104 and 108.

Figure 2C:
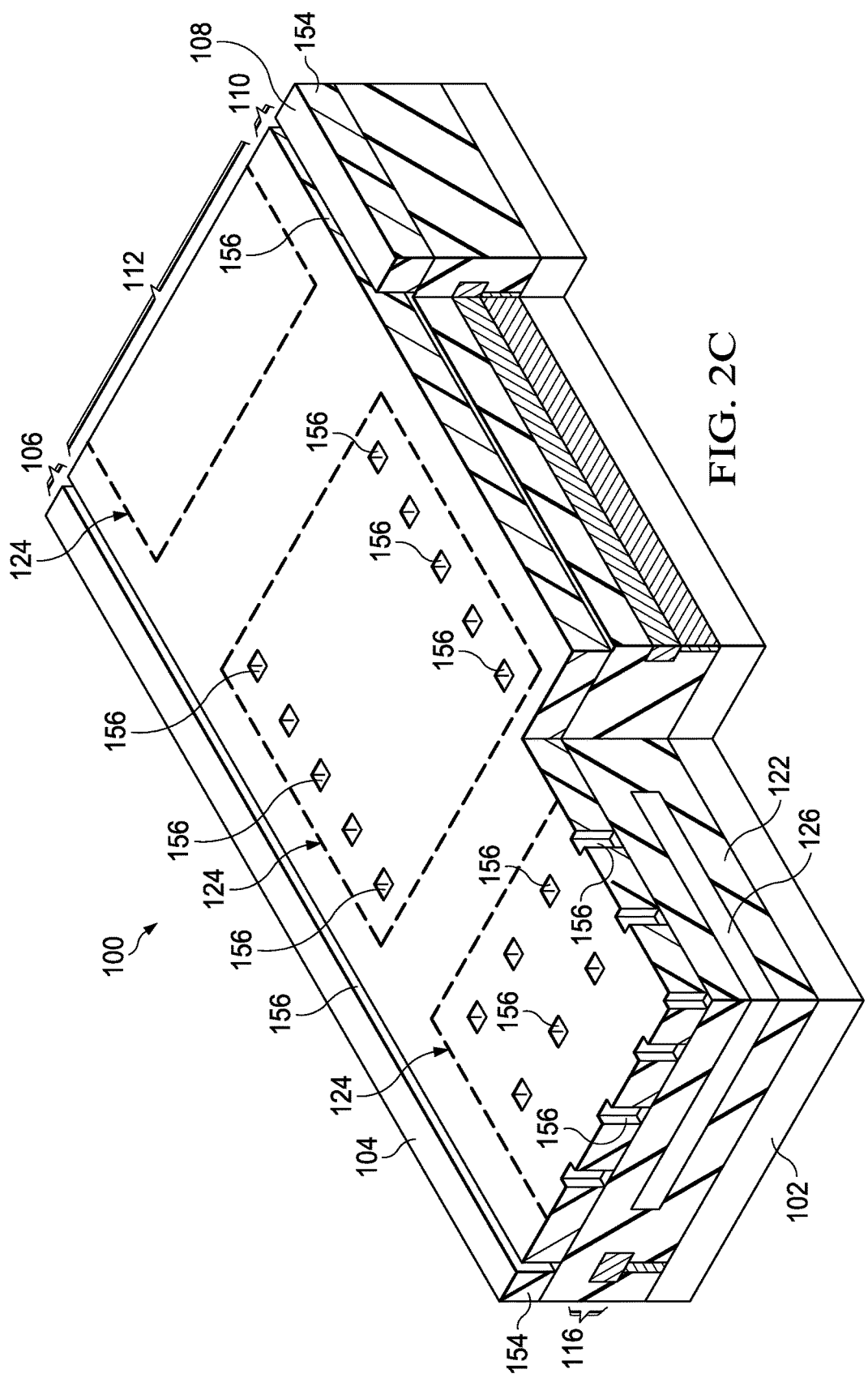

Referring to FIG. 2C, a first interconnect etch process is performed which removes metal from the first interconnect metal layer 150 exposed by the first interconnect etch mask 152 of FIG. 2B, for example using a reactive ion etch (RIE) process, so as to form elements of the first interconnect level 116 including interconnect elements, not shown, in the first and second integrated circuits 104 and 108, the unsegmented first probe pads 126 and scribe seal lines in the first and second scribe seals 106 and 110. The first interconnect etch mask 152 is removed after the first interconnect etch process is completed. It will be recognized that the elements of the first interconnect level 116 may alternatively be formed using a damascene process.

Formation of the dielectric layer stack 122 is continued by formation of a first intra-metal dielectric (IMD) layer between the elements of the first interconnect level 116. The first IMD layer may be formed, for example, using MSQ. Formation of the dielectric layer stack 122 is further continued by formation of a first inter-level dielectric (ILD) layer over the first IMD layer and the elements of the first interconnect level 116. The first ILD layer may include, for example, an etch stop layer including silicon nitride, silicon carbide, silicon oxy nitride and/or silicon carbide nitride, a main layer of silicon dioxide, OSG, SiCO or CDO and/or MSQ, and a cap layer of, for example, silicon carbide, silicon oxy nitride and/or silicon carbide nitride, and be formed, for example, by PECVD processes.

A first via etch mask 154 is formed over the existing dielectric layer stack 122 so as to expose areas 156 for etching via holes in the first and second integrated circuits 104 and 108, and in the saw lane 112, and possibly scribe seal lines in the scribe seals 106 and 110. The first via etch mask 154 may include, for example, photoresist and/or dielectric hard mask layers such as silicon nitride, silicon carbide or silicon carbide nitride. The first via etch mask 154 may be formed, for example, by photolithographic processes and possibly a hard mask etch process.

Figure 2D:
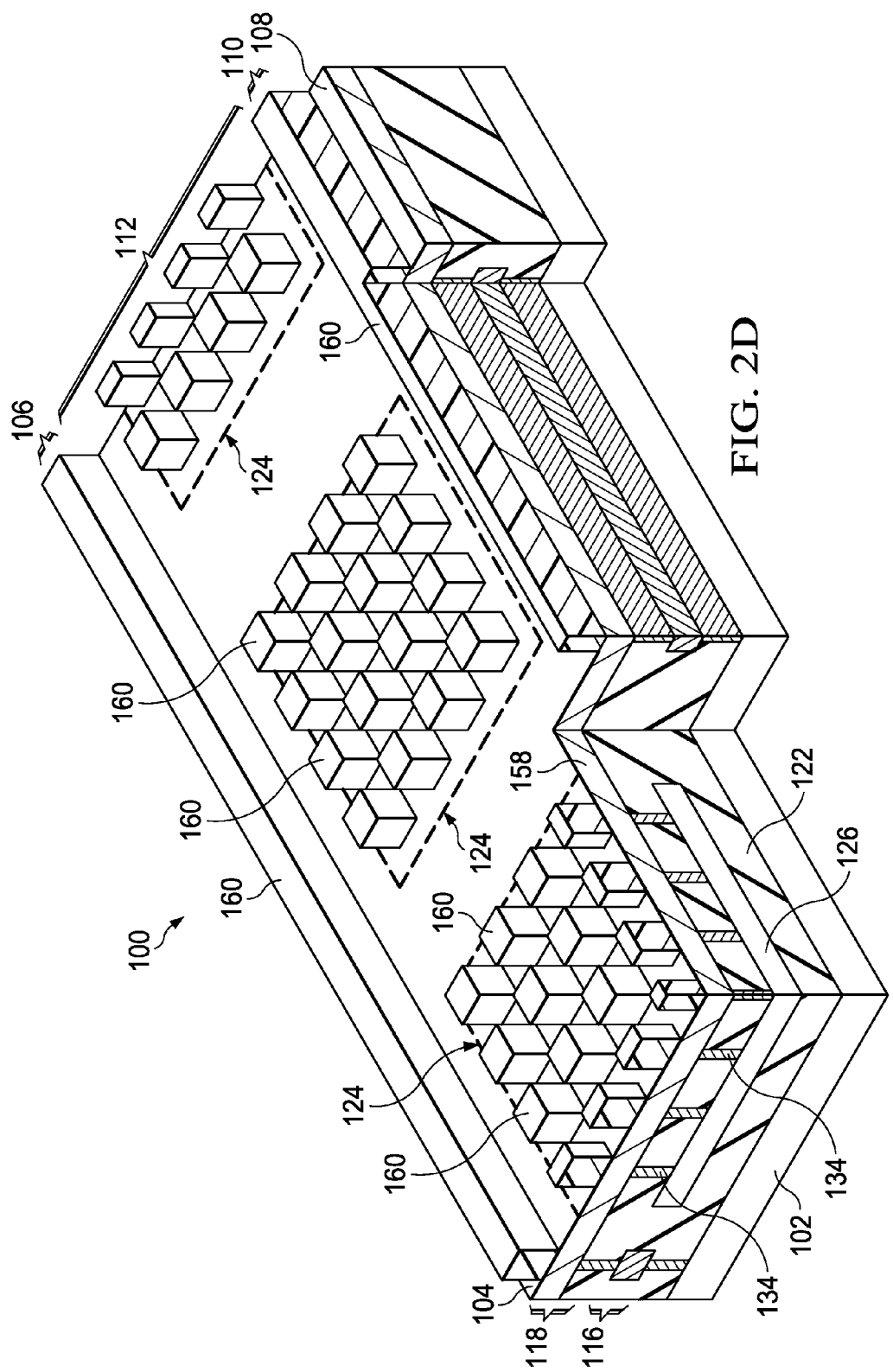

Referring to FIG. 2D, a first via etch process is performed on the wafer 100 which removes material from the first ILD layer in the first via holes and scribe seal lines exposed by the first via etch mask 154 of FIG. 2C. The first via etch mask 154 is removed after the first via etch process is completed. The first via holes and scribe seal lines are filled with via metal, for example, a liner of titanium and/or titanium nitride and a fill metal of tungsten. The liner may be formed by MOCVD and/or ALD processes, and the fill metal may be formed by a CVD process. A subsequent etchback process and/or CMP process may remove fill metal and liner metal from an existing top surface of the dielectric layer stack 122, so as to form the vias 134 between the first interconnect level 116 and the second interconnect level 118.

A second interconnect metal layer 158, for example a layer stack including an adhesion layer of titanium, titanium tungsten or titanium nitride 5 to 20 nanometers thick, a main layer of aluminum or aluminum alloy 150 to 350 nanometers thick, and a cap layer of titanium nitride 5 to 20 nanometers thick, is formed over the existing dielectric layer stack 122. The second interconnect metal layer 158 may be formed, for example, by a combination of MOCVD, ALD, and sputtering.

A second interconnect etch mask 160 is formed over the second interconnect metal layer 158 so as to define areas for elements of the second interconnect level 118 of FIG. 1. The second interconnect etch mask 160 defines areas for the pad segments 132 of the second probe pads 128 of FIG. 1 and scribe seal lines in the scribe seals 106 and 108, and interconnect lines, not shown, in the first and second integrated circuits 104 and 108. The second interconnect etch mask 160 may include, for example, photoresist and be formed, for example, by a photolithographic process.

Figure 2E:
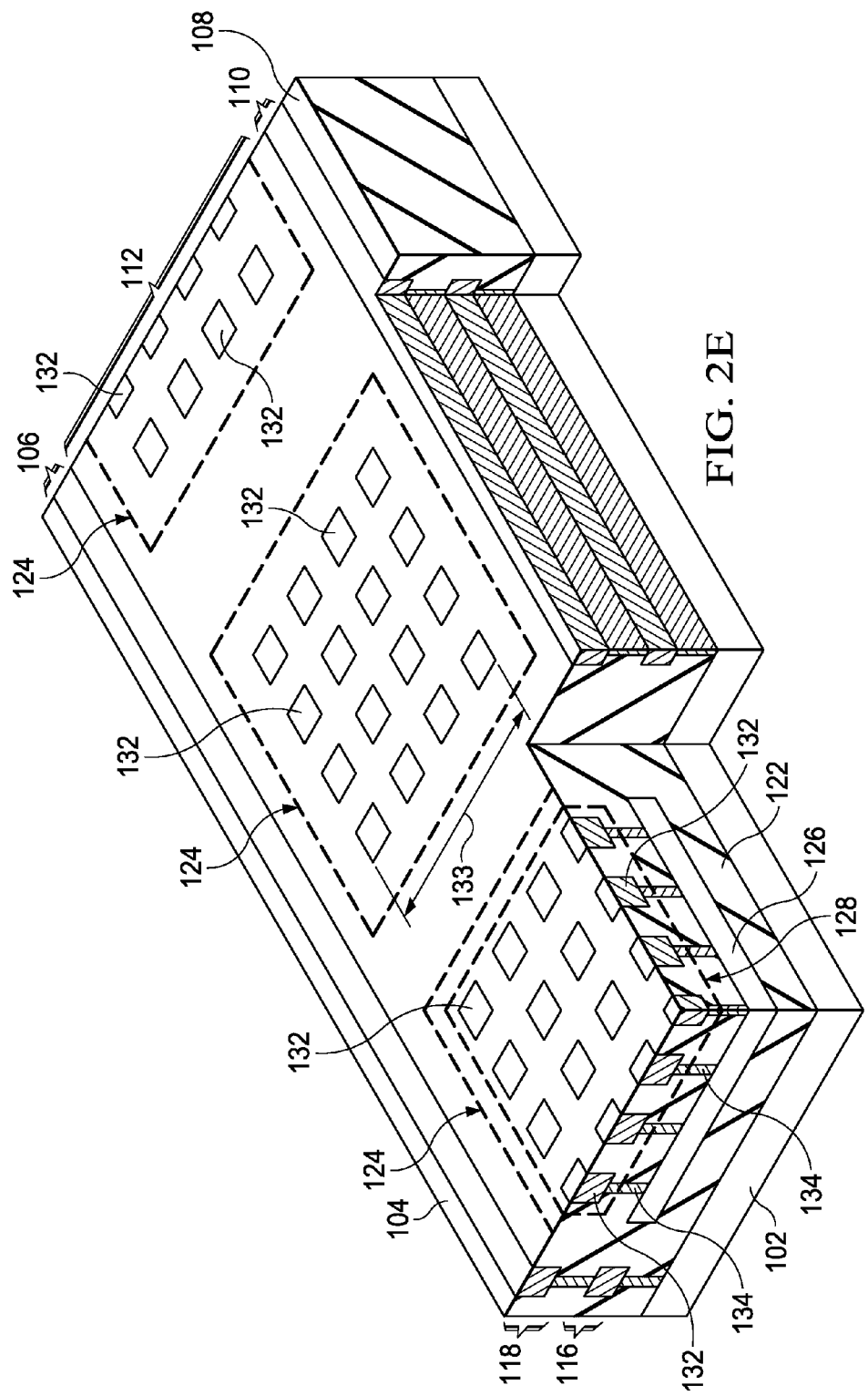

Referring to FIG. 2E, a second interconnect etch process is performed which removes metal from the second interconnect metal layer 158 exposed by the second interconnect etch mask 160 of FIG. 2D, for example using an RIE process, so as to form elements of the second interconnect level 118 including interconnect elements, not shown, in the first and second integrated circuits 104 and 108, the pad segments 132 of the second probe pads 128 and scribe seal lines in the first and second scribe seals 106 and 110. A probe pad width 133 of each instance of the second probe pads 128 is defined as described in reference to FIG. 1. The second interconnect etch mask 160 is removed after the second interconnect etch process is completed. It will be recognized that the elements of the second interconnect level 118 may alternatively be formed using a copper damascene process, with a liner metal and planarized copper in interconnect trenches, rather than the etched metal process described in reference to FIG. 2D and FIG. 2E.

Figure 2F:
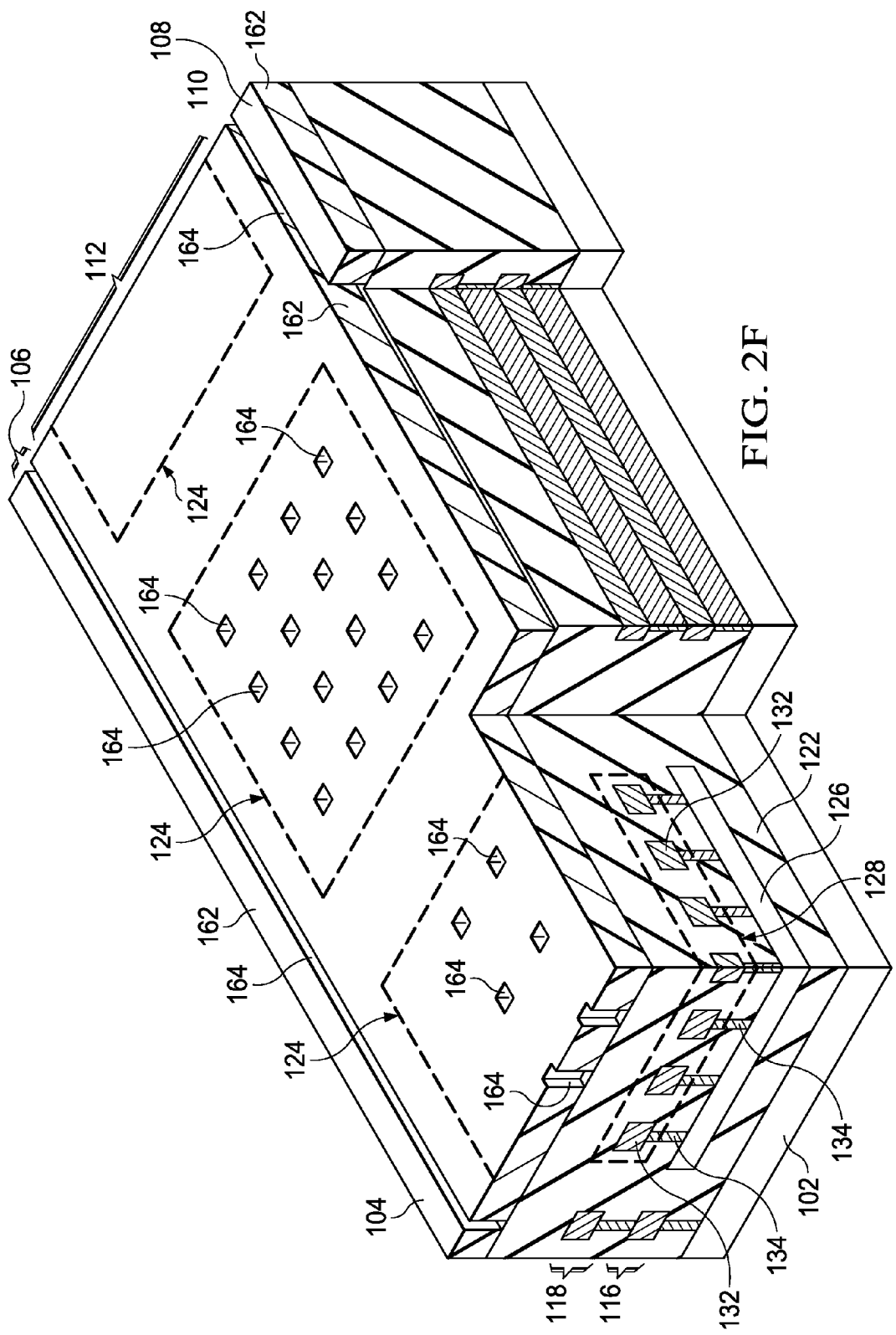

Referring to FIG. 2F, formation of the dielectric layer stack 122 is continued by formation of a second ILD layer over the first ILD layer and the elements of the second interconnect level 118. The second ILD layer may include, for example, an etch stop layer including silicon nitride, silicon carbide, silicon oxy nitride and/or silicon carbide nitride, a main layer of silicon dioxide, OSG, SiCO or CDO and/or MSQ, and a cap layer of, for example, silicon carbide, silicon oxy nitride and/or silicon carbide nitride, and be formed, for example, by PECVD processes. A thickness of the second ILD layer is sufficient to accommodate the vias 142 between the second interconnect level 118 and the third interconnect level 120 and the elements of the third interconnect level 120.

A second via etch mask 162 is formed over the second ILD layer so as to expose areas 164 for etching via holes in the first and second integrated circuits 104 and 108, and in the saw lane 112, and possibly scribe seal lines in the scribe seals 106 and 110. The second via etch mask 162 may include, for example, photoresist and/or dielectric hard mask layers such as silicon nitride, silicon carbide or silicon carbide nitride. The second via etch mask 162 may be formed, for example, by photolithographic processes and possibly a hard mask etch process.

Figure 2G:
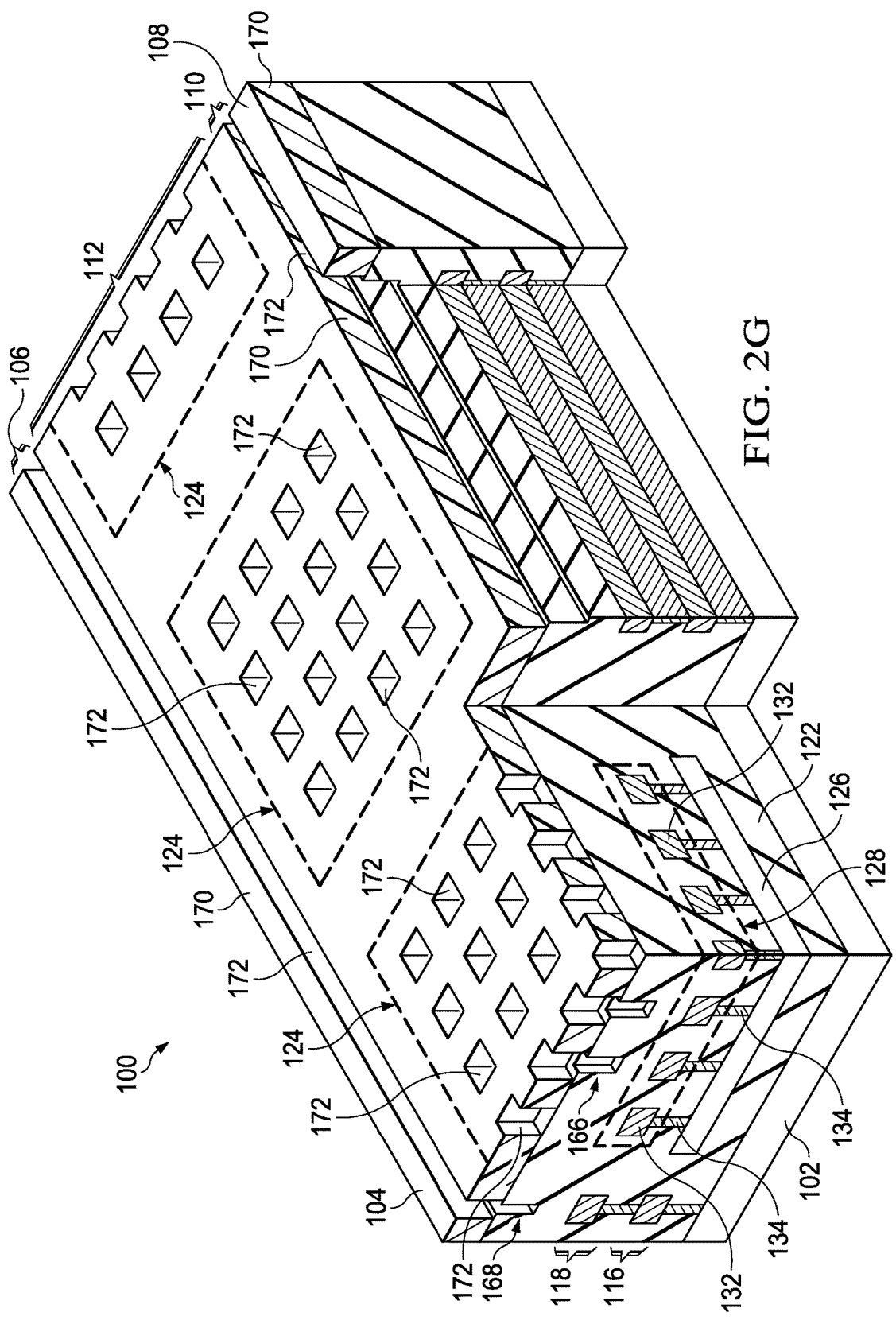

Referring to FIG. 2G, a second via etch process is performed on the wafer 100 which removes material from the second ILD layer in the second via holes and scribe seal lines exposed by the second via etch mask 162 of FIG. 2F so as to form second via holes 166 and scribe seal trenches 168 in the second ILD layer. In one version of the instant embodiment, the second via holes 166 and scribe seal trenches 168 extend partway to the second interconnect level 118 as depicted in FIG. 2G. In other versions, the second via holes 166 and scribe seal trenches 168 may extend to an etch stop layer over the second interconnect level 118. The second via etch mask 162 is removed after the second via etch process is completed.

A third interconnect trench etch mask 170 is formed over the second ILD layer so as to expose areas 172 for etching interconnect trenches in the first and second integrated circuits 104 and 108, and in the saw lane 112, and possibly scribe seal lines in the scribe seals 106 and 110. The third interconnect trench etch mask 170 may include, for example, photoresist and/or dielectric hard mask layers such as silicon nitride, silicon carbide or silicon carbide nitride. The third interconnect trench etch mask 170 may be formed, for example, by photolithographic processes and possibly a hard mask etch process. The second via holes 166 and possibly the scribe seal trenches 168 are exposed by the third interconnect trench etch mask 170. The third interconnect trench etch mask 170 is segmented so as to produce the segmented configuration of the third probe pads 130 of FIG. 1.

Figure 2H:
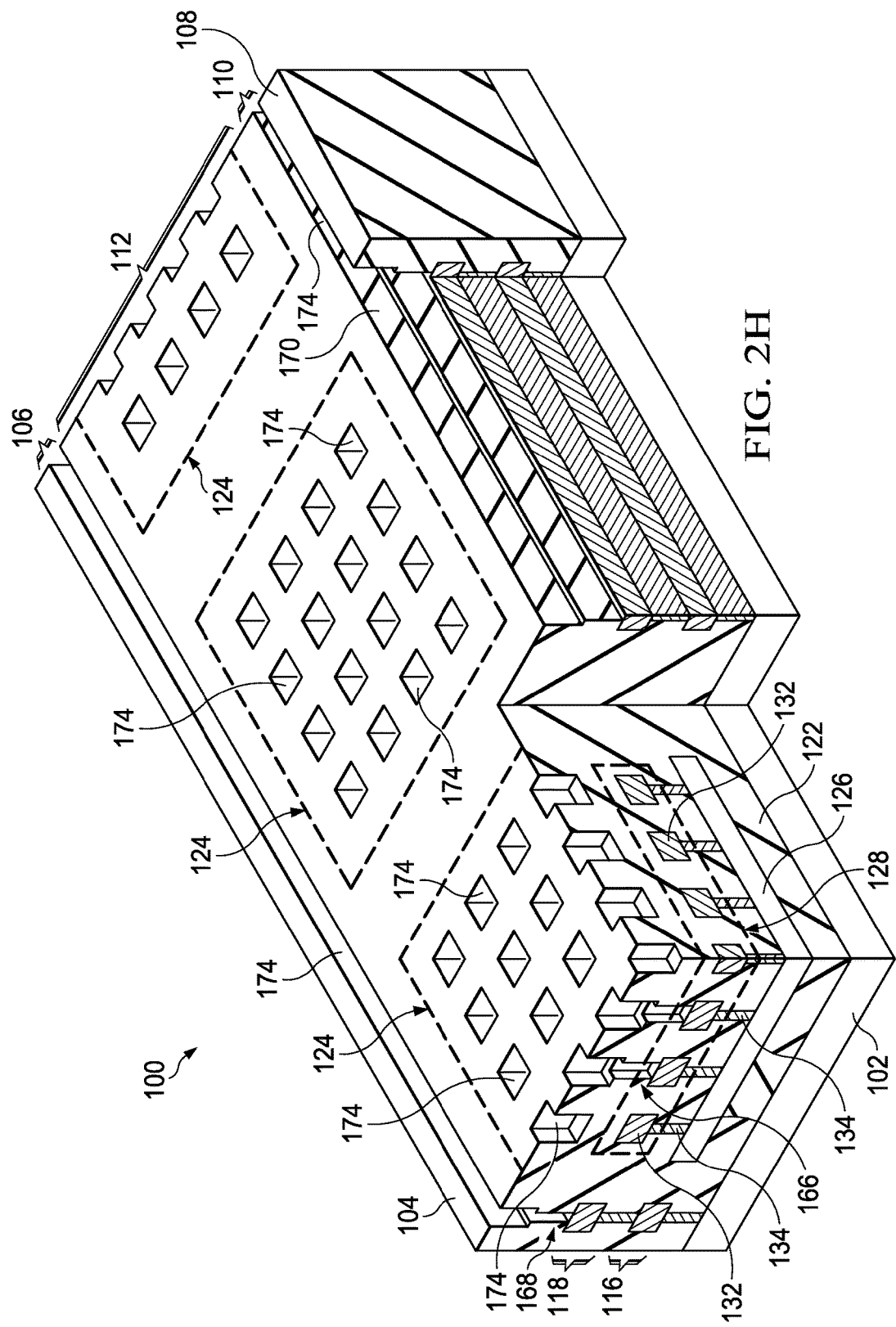

Referring to FIG. 2H, a third interconnect trench etch process is performed on the wafer 100 which removes material from the second ILD layer so as to form the interconnect trenches 174 in the second ILD layer. During the third interconnect trench etch process, the second via holes 166 and scribe seal lines 168 are extended downward so as to expose elements of the second interconnect level 118. The third interconnect trench etch mask 170 is removed after the third interconnect trench etch process is completed.

Figure 2I:
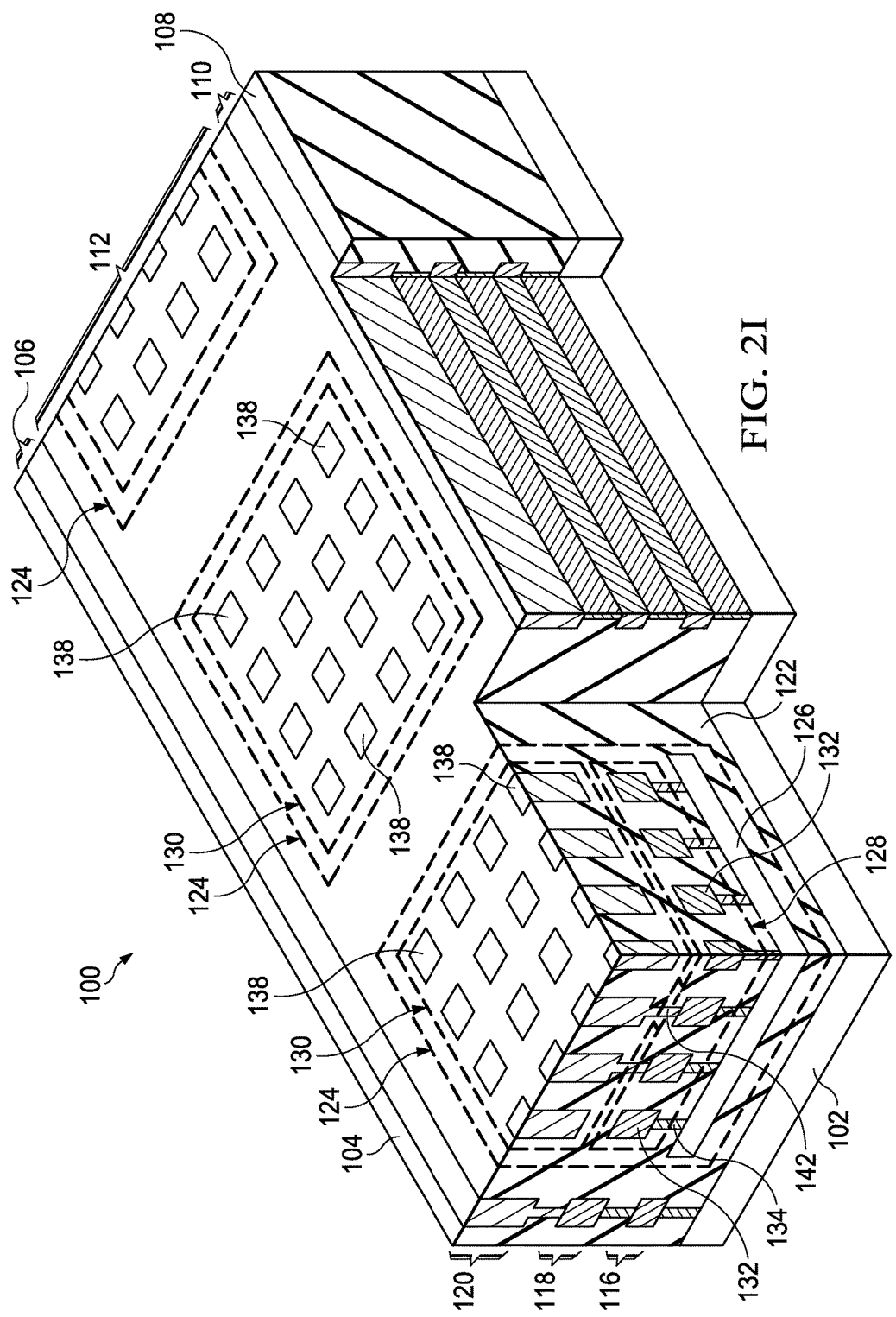

Referring to FIG. 2I, a metal liner and fill metal are formed on the wafer 100 in the interconnect trenches 174, the second via holes 166 and scribe seal lines 168. The metal liner may include, for example, tantalum nitride or titanium nitride, formed by MOCVD or ALD processes. The fill metal may include, for example, copper formed by a combination of sputtering and electroplating. The metal liner and fill metal may extend onto an existing top surface of the second ILD layer. The metal liner and fill metal may be removed from the top surface of the second ILD layer, for example, by a CMP process or a combination of CMP and etchback processes, so as to form the pad segments 138 of the third probe pads 130, the vias 142 between the second interconnect level 118 and the third interconnect level 120, and scribe seal lines in the scribe seals 106 and 110. It will be recognized that the third probe pads 130 and the vias 142 may be formed using a single damascene process, instead of the dual damascene process described in reference to FIG. 2F through FIG. 2I. It will further be recognized that the third probe pads 130 may be formed with an etched aluminum metal process, as described in reference to FIG. 2D and FIG. 2E, rather than the dual damascene process described in reference to FIG. 2F through FIG. 2I.

In one version of the instant embodiment, probe pads in a top interconnect level of a wafer may be segmented, for example, as described in reference to FIG. 2F through FIG. 2I. In an alternate version, probe pads in each of a plurality of interconnect levels closest to a top surface of a wafer may be segmented. In a further version, probe pads in all interconnect levels of a wafer may be segmented. In one version, probe pads in a thickest interconnect level of a wafer may be segmented. In another version, probe pads in a plurality of thickest interconnect levels of a wafer may be segmented.

It will be recognized that semiconductor wafers may include more than three interconnect levels, and segmented probe pads may be formed in any combination of the interconnect levels. It will further be recognized that segmented probe pads in a saw lane of a semiconductor wafer may be formed by any combination of etched metal and damascene processes. Other process sequences of forming segmented probe pads are within the scope of the instant invention.

Figure 3:
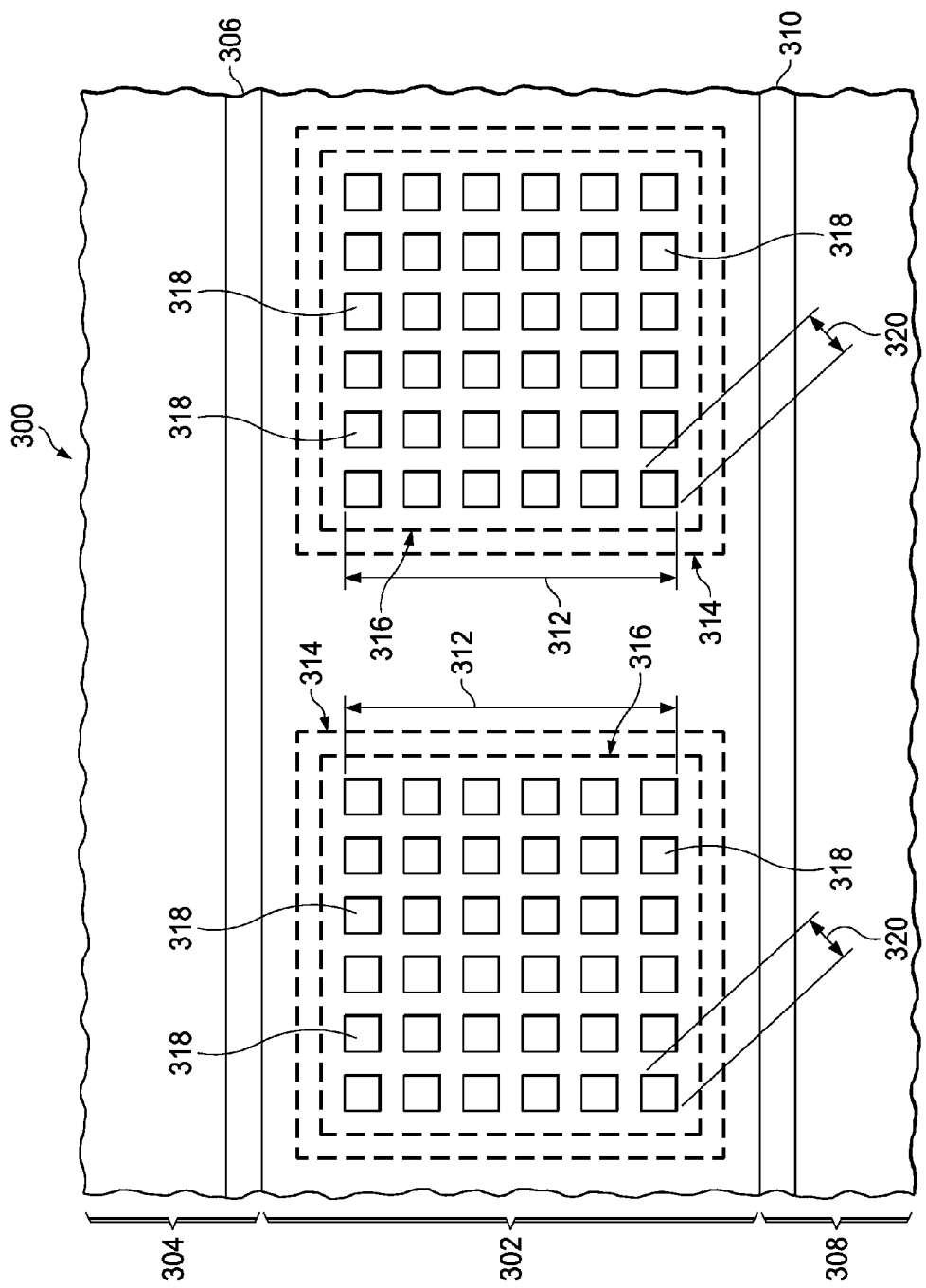
FIG. 3 is a top view of a semiconductor wafer containing a saw lane between adjacent integrated circuits with a plurality of segmented probe pads formed according to an embodiment.

FIG. 3 is a top view of a semiconductor wafer containing a saw lane between adjacent integrated circuits with a plurality of segmented probe pads formed according to an embodiment. The wafer 300 contains the saw lane 302 disposed between a first integrated circuit 304 and a second integrated circuit 308. The first integrated circuit 304 may include an optional first scribe seal 306 and the second integrated circuit 308 may include an optional second scribe seal 310. The saw lane 302 contains a plurality of probe pad structures 314 with segmented probe pads 316. Each instance of the segmented probe pads 316 has a probe pad width 312 as described in reference to FIG. 1. The probe pads 316 include pad segments 318, each of which have a maximum lateral dimension 320 which is up to 75 percent of the probe pad width 312. The probe pad structures 314 are free of segments which have a maximum lateral dimension greater than 75 percent of the probe pad width 312. In one version of the instant embodiment, the maximum lateral dimension 320 of each instance of the pad segments 318 is up to 50 percent of the probe pad width 312, and the probe pad structures 314 are free of segments which have a maximum lateral dimension greater than 50 percent of the probe pad width 312. In a further version, the maximum lateral dimension 320 of each instance of the pad segments 318 is up to 25 percent of the probe pad width 312, and the probe pad structures 314 are free of segments which have a maximum lateral dimension greater than 25 percent of the probe pad width 312. In the instant embodiment, the pad segments 318 are configured in a rectangular array in each probe pad 316.

Figure 4:
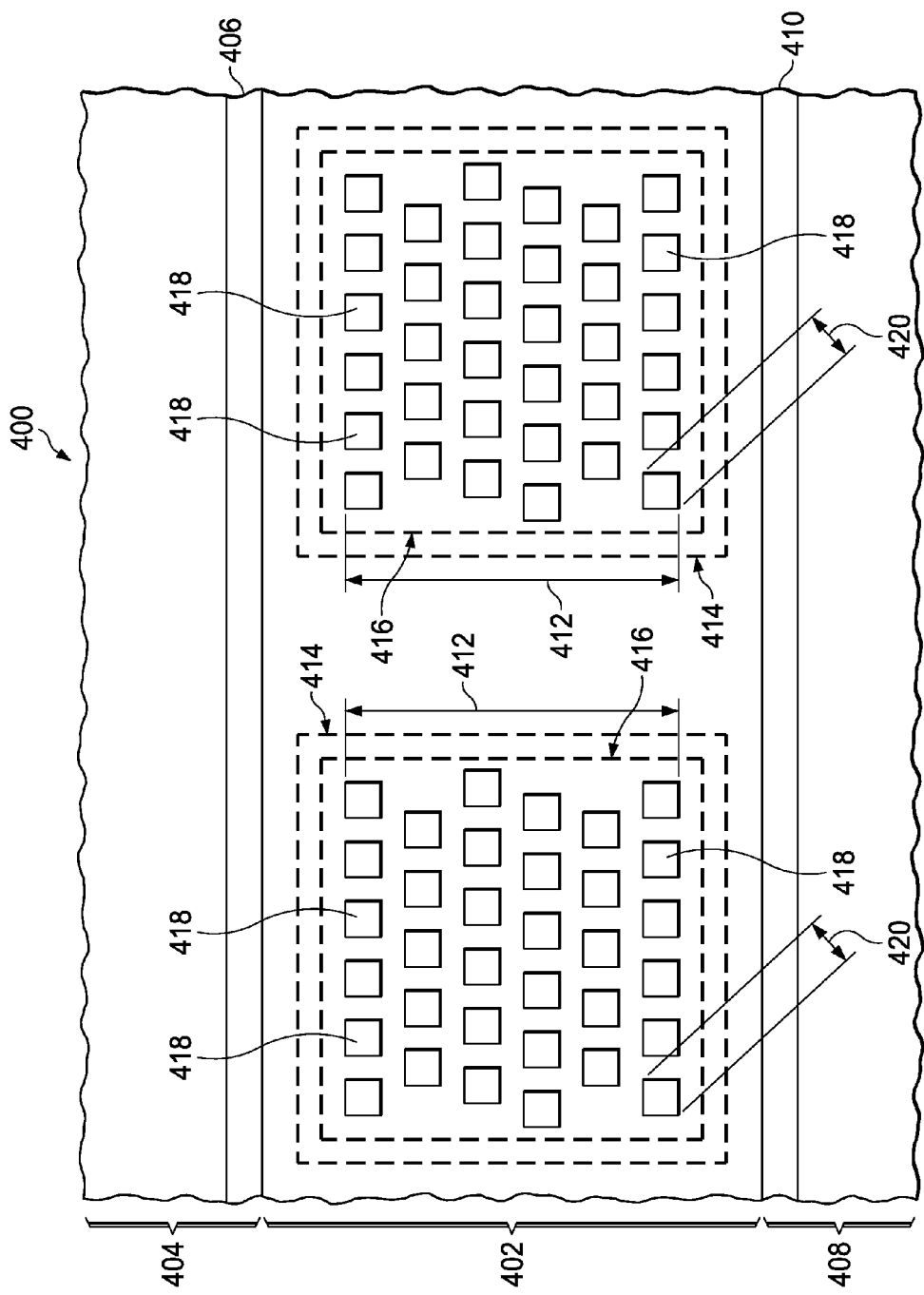
FIG. 4 is a top view of a semiconductor wafer containing a saw lane between adjacent integrated circuits with a plurality of segmented probe pads formed according to another embodiment.

FIG. 4 is a top view of a semiconductor wafer containing a saw lane between adjacent integrated circuits with a plurality of segmented probe pads formed according to another embodiment. The wafer 400 contains the saw lane 402 disposed between a first integrated circuit 404 and a second integrated circuit 408. The first integrated circuit 404 may include an optional first scribe seal 406 and the second integrated circuit 408 may include an optional second scribe seal 410. The saw lane 402 contains a plurality of probe pad structures 414 with segmented probe pads 416. Each instance of the segmented probe pads 416 has a probe pad width 412 as described in reference to FIG. 1. The probe pads 416 include pad segments 418, each of which have a maximum lateral dimension 420 which is up to 75 percent of the probe pad width 412. The probe pad structures 414 are free of segments which have a maximum lateral dimension greater than 75 percent of the probe pad width 412. In one version of the instant embodiment, the maximum lateral dimension 420 of each instance of the pad segments 418 is up to 50 percent of the probe pad width 412, and the probe pad structures 414 are free of segments which have a maximum lateral dimension greater than 50 percent of the probe pad width 412. In a further version, the maximum lateral dimension 420 of each instance of the pad segments 418 is up to 25 percent of the probe pad width 412, and the probe pad structures 414 are free of segments which have a maximum lateral dimension greater than 25 percent of the probe pad width 412. In the instant embodiment, the pad segments 418 are configured in a staggered array in each probe pad 416.

Figure 5:
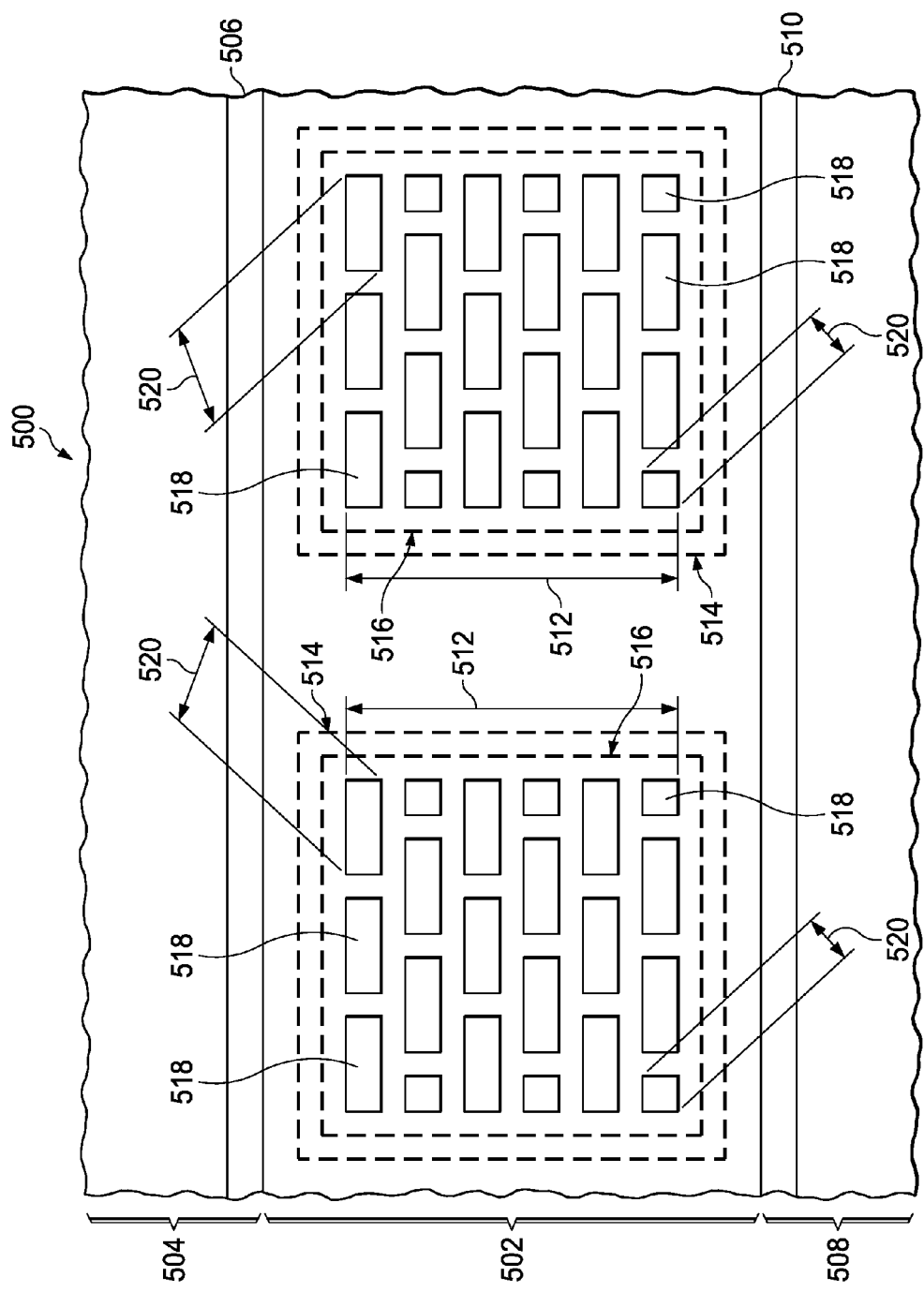
FIG. 5 is a top view of a semiconductor wafer containing a saw lane between adjacent integrated circuits with a plurality of segmented probe pads formed according to an alternate embodiment.

FIG. 5 is a top view of a semiconductor wafer containing a saw lane between adjacent integrated circuits with a plurality of segmented probe pads formed according to an alternate embodiment. The wafer 500 contains the saw lane 502 disposed between a first integrated circuit 504 and a second integrated circuit 508. The first integrated circuit 504 may include an optional first scribe seal 506 and the second integrated circuit 508 may include an optional second scribe seal 510. The saw lane 502 contains a plurality of probe pad structures 514 with segmented probe pads 516. Each instance of the segmented probe pads 516 has a probe pad width 512 as described in reference to FIG. 1. The probe pads 516 include pad segments 518, each of which have a maximum lateral dimension 520 which is up to 75 percent of the probe pad width 512. The probe pad structures 514 are free of segments which have a maximum lateral dimension greater than 75 percent of the probe pad width 512. In one version of the instant embodiment, the maximum lateral dimension 520 of each instance of the pad segments 518 is up to 50 percent of the probe pad width 512, and the probe pad structures 514 are free of segments which have a maximum lateral dimension greater than 50 percent of the probe pad width 512. In a further version, the maximum lateral dimension 520 of each instance of the pad segments 518 is up to 25 percent of the probe pad width 512, and the probe pad structures 514 are free of segments which have a maximum lateral dimension greater than 25 percent of the probe pad width 512. In the instant embodiment, the pad segments 518 are rectangular in shape and are configured in a half-offset array in each probe pad 516.

Figure 6:
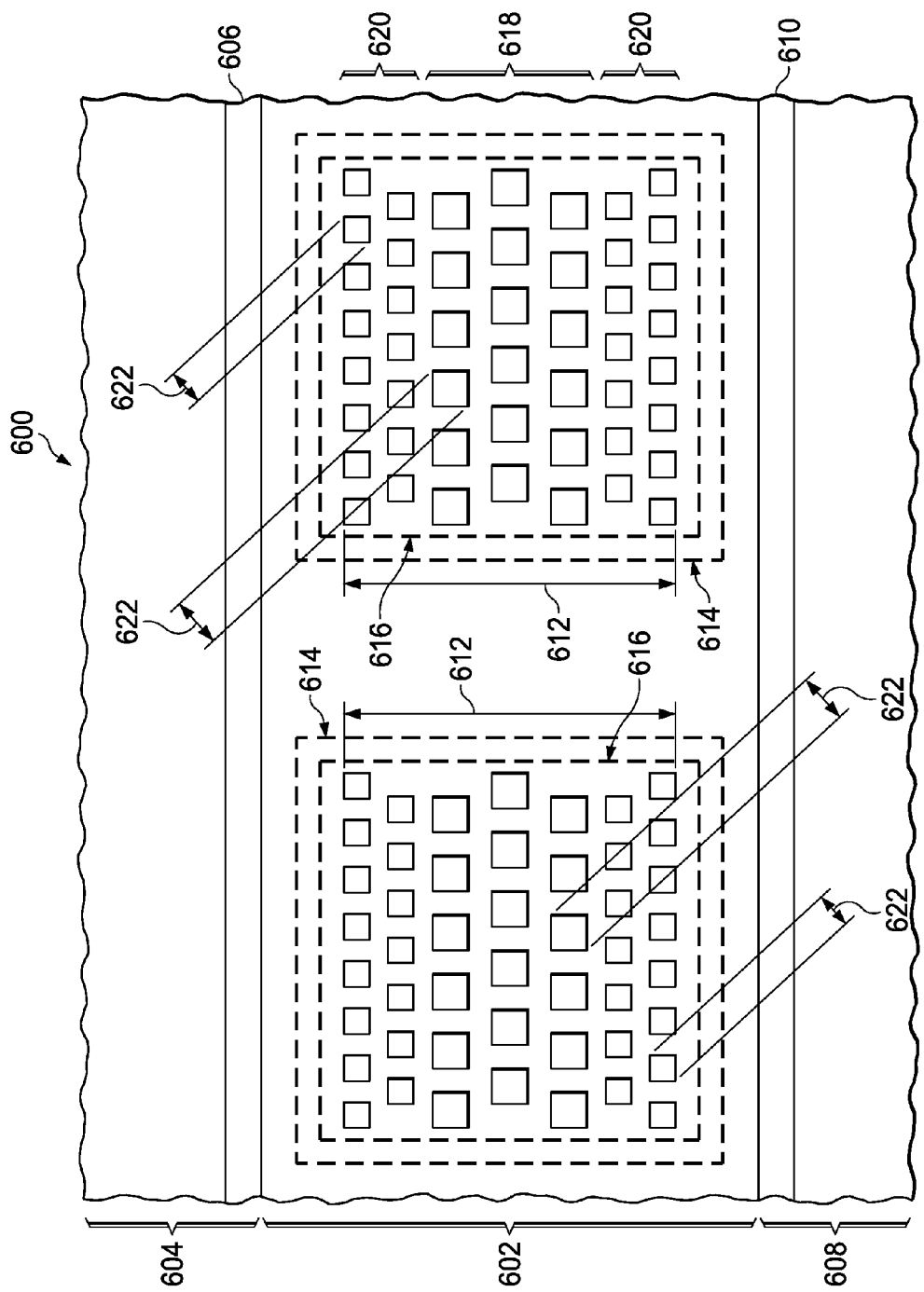
FIG. 6 is a top view of a semiconductor wafer containing a saw lane between adjacent integrated circuits with a plurality of segmented probe pads formed according to a further embodiment.

FIG. 6 is a top view of a semiconductor wafer containing a saw lane between adjacent integrated circuits with a plurality of segmented probe pads formed according to a further embodiment. The wafer 600 contains the saw lane 602 disposed between a first integrated circuit 604 and a second integrated circuit 608. The first integrated circuit 604 may include an optional first scribe seal 606 and the second integrated circuit 608 may include an optional second scribe seal 610. The saw lane 602 contains a plurality of probe pad structures 614 with segmented probe pads 616. Each instance of the segmented probe pads 616 has a probe pad width 612 as described in reference to FIG. 1. In the instant embodiment, each probe pad 616 includes a first plurality of large pad segments 618 disposed in a central band of the probe pad 616 and a second plurality of small pad segments 620 disposed in outer bands of the probe pad 616. The large pad segments 618 may have, for example, an area twice as large as an area of the small pad segments 620. Each of the large pad segments 618 and the small pad segments 620 have a maximum lateral dimension 622 which is up to 75 percent of the probe pad width 612. The probe pad structures 614 are free of segments which have a maximum lateral dimension greater than 75 percent of the probe pad width 612. In one version of the instant embodiment, the maximum lateral dimension 622 of each instance of the large pad segments 618 and the small pad segments 620 is up to 50 percent of the probe pad width 612, and the probe pad structures 614 are free of segments which have a maximum lateral dimension greater than 50 percent of the probe pad width 612. In a further version, the maximum lateral dimension 622 of each instance of the large pad segments 618 and the small pad segments 620 is up to 25 percent of the probe pad width 612, and the probe pad structures 614 are free of segments which have a maximum lateral dimension greater than 25 percent of the probe pad width 612.

Figure 7:
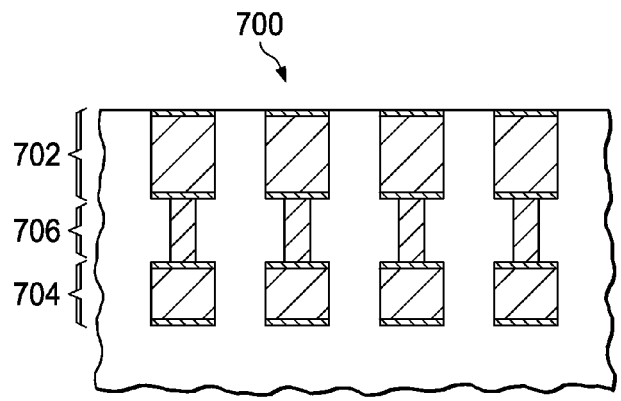
FIG. 7 through FIG. 14 are cross sections of semiconductor wafers with probe pad structures formed according to various embodiments.
Figure 8:
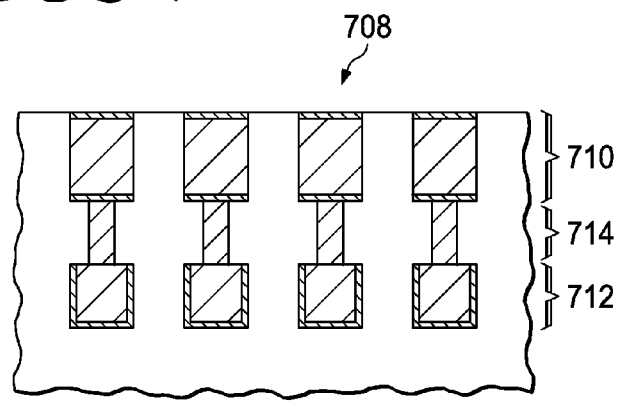
Figure 9:
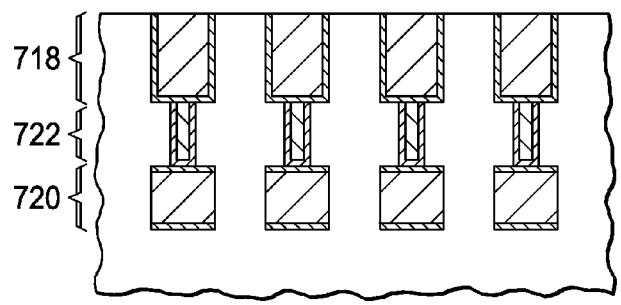
Figure 10:
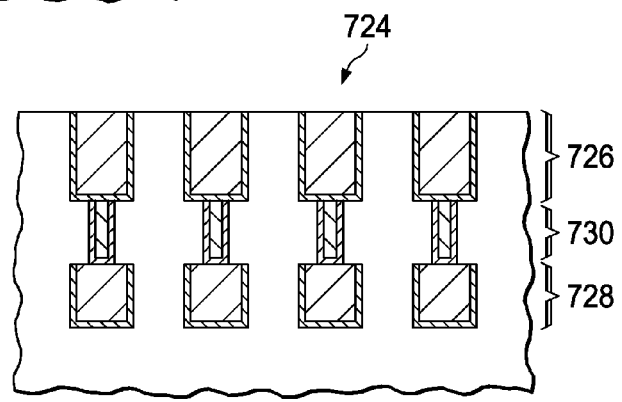
Figure 11:
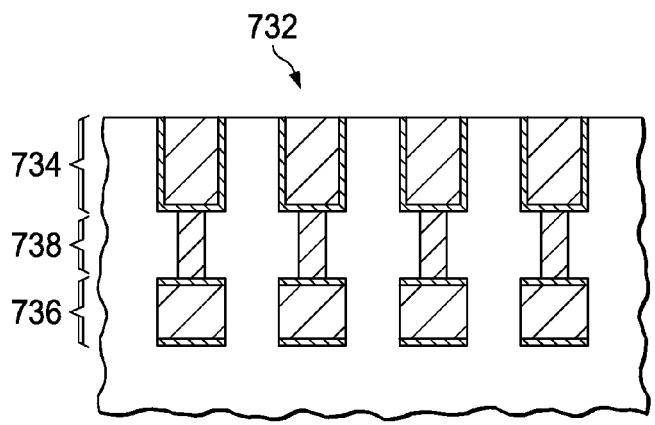
Figure 12:
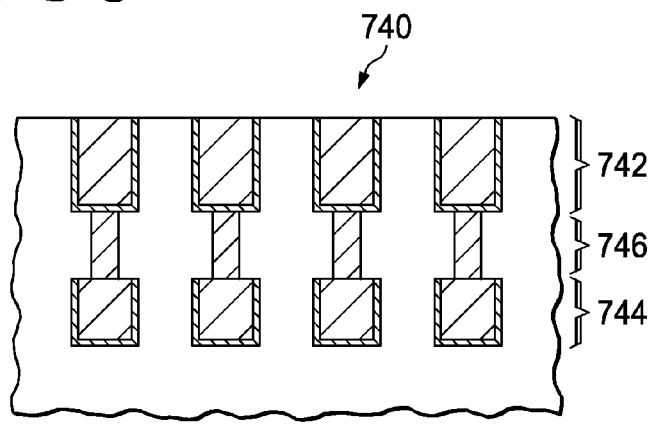
Figure 13:
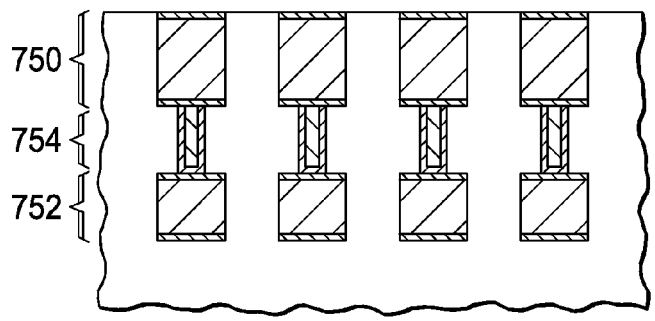
Figure 14:
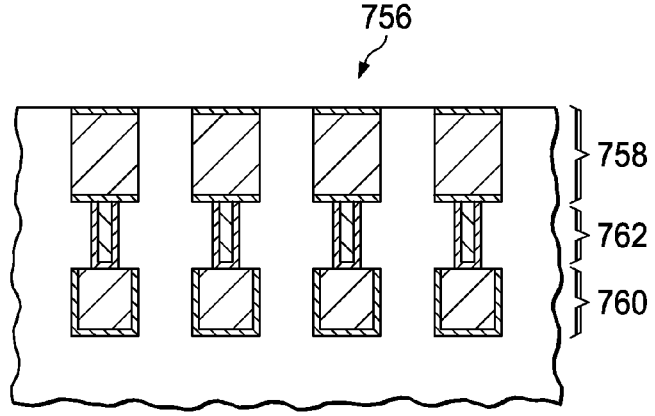

FIG. 7 through FIG. 14 are cross sections of semiconductor wafers with probe pad structures formed according to various embodiments. FIG. 7 depicts a wafer 700 with a probe pad structure including a first segmented probe pad 702 of etch defined aluminum alloy sandwiched between layers of titanium nitride over a second segmented probe pad 704 of etch defined aluminum alloy sandwiched between layers of titanium nitride connected by tungsten vias 706. FIG. 8 depicts a wafer 708 with a probe pad structure including a first segmented probe pad 710 of etch defined aluminum alloy sandwiched between layers of titanium nitride over a second segmented probe pad 712 of single damascene copper connected by tungsten vias 714. FIG. 9 depicts a wafer 716 with a probe pad structure including a first segmented probe pad 718 of single damascene copper over a second segmented probe pad 720 of etch defined aluminum alloy sandwiched between layers of titanium nitride connected by single damascene copper vias 722. FIG. 10 depicts a wafer 724 with a probe pad structure including a first segmented probe pad 726 of single damascene copper over a second segmented probe pad 728 of single damascene copper connected by single damascene copper vias 730. FIG. 11 depicts a wafer 732 with a probe pad structure including a first segmented probe pad 734 of single damascene copper over a second segmented probe pad 736 of etch defined aluminum alloy sandwiched between layers of titanium nitride connected by tungsten vias 738. FIG. 12 depicts a wafer 740 with a probe pad structure including a first segmented probe pad 742 of single damascene copper over a second segmented probe pad 744 of single damascene copper connected by tungsten vias 746. FIG. 13 depicts a wafer 748 with a probe pad structure including a first segmented probe pad 750 of etch defined aluminum alloy sandwiched between layers of titanium nitride connected over a second segmented probe pad 752 of etch defined aluminum alloy sandwiched between layers of titanium nitride connected by single damascene copper vias 754. FIG. 14 depicts a wafer 756 with a probe pad structure including a first segmented probe pad 758 of etch defined aluminum alloy sandwiched between layers of titanium nitride connected over a second segmented probe pad 760 of single damascene copper connected by single damascene copper vias 762.

Figure 15:
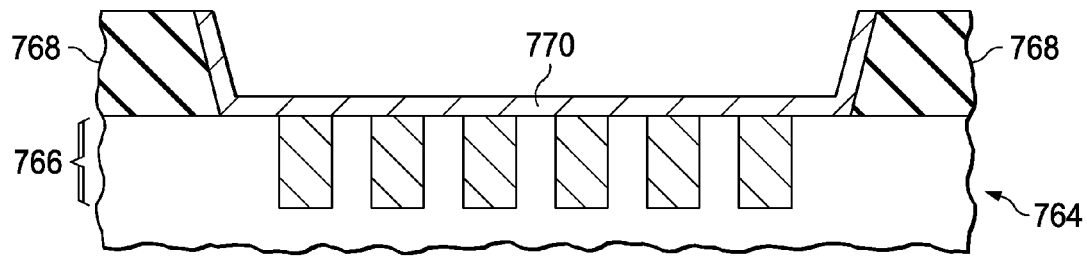
FIG. 15 through FIG. 17 are cross sections of semiconductor wafers with probe pad structures and overlying unsegmented surface pads, formed according to embodiments.
Figure 16:
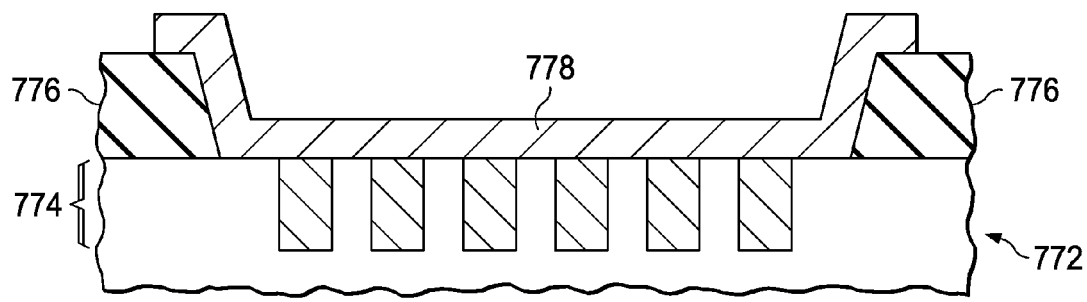
Figure 17:
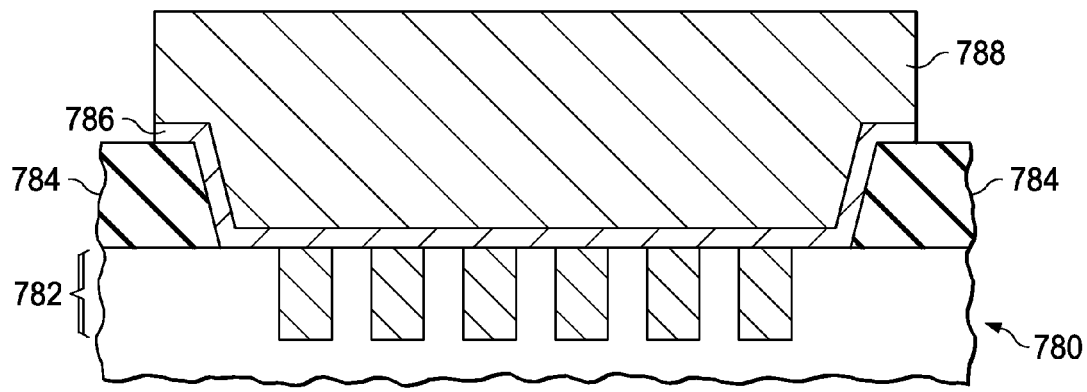

FIG. 15 through FIG. 17 are cross sections of semiconductor wafers with probe pad structures and overlying unsegmented surface pads, formed according to embodiments. Referring to FIG. 15, the wafer 764 has a probe pad structure with a segmented probe pad 766. A protective overcoat 768 is formed over the wafer 764 with an opening over the segmented probe pad 766. A layer of surface pad metal is formed on the protective overcoat 768 and in the opening so as to make electrical connection to the segmented probe pad 766. The surface pad metal may be, for example, a layer stack including a sputtered first layer of titanium, titanium tungsten, titanium nitride, tantalum or tantalum nitride, and one or more layers of nickel, palladium, chromium, platinum and/or gold. The nickel, palladium, chromium, platinum and gold layers may be sputtered, electroplated or electroless plated. A portion of the surface pad metal on the protective overcoat 768 is removed, for example using a CMP operation, so as to form an unsegmented surface pad 770 which is self-aligned with the opening in the protective overcoat 768.

Referring to FIG. 16, the wafer 772 has a probe pad structure with a segmented probe pad 774. A protective overcoat 776 is formed over the wafer 772 with an opening over the segmented probe pad 774. A layer of surface pad metal, for example a layer of titanium nitride and a layer of sputtered aluminum, is formed on the protective overcoat 776 and in the opening so as to make electrical connection to the segmented probe pad 774. The surface pad metal is patterned, for example by forming a photoresist etch mask over the surface pad metal to cover the opening in the protective overcoat 776 and etching the surface pad metal using an RIE process, so as to form an unsegmented surface pad 778 which overlaps onto a top surface of the protective overcoat 776.

Referring to FIG. 17, the wafer 780 has a probe pad structure with a segmented probe pad 782. A protective overcoat 784 is formed over the wafer 780 with an opening over the segmented probe pad 784. An unsegmented plated surface pad 788 is formed on the segmented probe pad 782 by depositing a metal seed layer 786, for example a first layer of sputtered titanium, titanium tungsten, titanium nitride, tantalum or tantalum nitride, and a second layer of sputtered copper or sputtered nickel, forming a plating mask on the seed layer 786 to expose the seed layer 786 over the segmented probe pad 782 and forming the unsegmented surface pad 788 by plating one or more layers of, for example, copper, nickel, palladium and/or gold.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor fabrication method comprising the steps of:
    forming a dielectric layer over a wafer;
    forming vias in the dielectric layer in a first integrated circuit of the wafer, in a second integrated circuit of the wafer, and in a saw lane of the wafer, the second integrated circuit being located adjacent to the first integrated circuit and the saw lane being located between and abutting the first integrated circuit and the second integrated circuit;
    forming elements of an interconnect level of the wafer in the dielectric layer over the vias, wherein the elements include interconnect elements in the first integrated circuit and the second integrated circuit and a plurality of pad segments forming a segmented probe pad of a probe pad structure in the saw lane.

2. The method of claim 1, further including forming an unsegmented probe pad of the probe pad structure in a metal interconnect level in the dielectric layer below the segmented probe pad, prior to forming the vias, so that the vias electrically connect between the unsegmented probe pad and the segmented probe pad.

3. The method of claim 2, wherein the vias are a first plurality of vias, the interconnect level is a first interconnect level, the interconnect elements are a first plurality of interconnect elements, the plurality of pad segments is a first plurality of pad segments and the segmented probe pad is a first segmented probe pad, and further including the steps of:
    forming a second plurality of vias in the dielectric layer in the first integrated circuit, in the second integrated circuit, and over the unsegmented probe pad in the saw lane;
    forming elements of a second interconnect level of the wafer in the dielectric layer, wherein the elements include a second plurality of interconnect elements in the first integrated circuit and the second integrated circuit and a second plurality of pad segments of a second segmented probe pad of the probe pad structure in the saw lane, wherein the second plurality of vias connect between the first segmented probe pad and the second segmented probe pad.

4. The semiconductor fabrication method of claim 1, wherein:
    a width of the probe pad structure is defined as a widest lateral distance between edges of the pad segments in the segmented probe pad, in a direction perpendicular to a boundary of the first integrated circuit abutting the saw lane and a boundary of the second integrated circuit abutting the saw lane, adjacent to the probe pad;
    a maximum lateral dimension of each instance of the plurality of pad segments is up to 75 percent of the probe pad structure width; and
    the segmented probe pad is free of instances of metal interconnect elements of the interconnect level which have a maximum lateral dimension greater than 75 percent of the probe pad structure width.

5. The method of claim 1, wherein the steps of forming the dielectric layer, the vias and the elements of an interconnect level comprises the steps of:
    forming an inter-level dielectric (ILD) layer over the wafer;

forming a via etch mask over the ILD layer so as to expose areas of the ILD layer for etching via holes in the first integrated circuit, the second integrated circuit, and the saw lane;
performing a first via etch process on the wafer which removes material from the ILD layer in the via holes exposed by the first via etch mask;
removing the via etch mask;
filling the via holes with via metal;
forming an interconnect metal layer over the ILD layer, the interconnect metal layer including a layer of aluminum alloy;
forming an interconnect etch mask over the interconnect metal layer so as to define areas for the elements;
performing an interconnect etch process which removes metal from the interconnect metal layer exposed by the interconnect etch mask so as to form the interconnect elements and the plurality of pad segments;
removing the interconnect etch mask; and
forming an intra-metal dielectric layer (IMD) layer between the elements of the interconnect level.

6. The method of claim 1, wherein the steps of forming the dielectric layer, the vias and the elements of an interconnect level comprises the steps of:
forming an ILD layer over the wafer;
forming a via etch mask over the ILD layer so as to expose areas of the ILD layer for etching via holes in the first integrated circuit, in the second integrated circuit, and in the saw lane;
performing a first via etch process on the wafer which removes material from the ILD layer in the via holes exposed by the first via etch mask;
removing the via etch mask;
forming an interconnect trench etch mask over the ILD layer so as to expose areas for etching interconnect trenches for interconnect elements in the first integrated circuit and the second integrated circuit and the plurality of pad segments in the saw lane;
performing an interconnect trench etch process which removes material from the ILD layer so as to form the interconnect trenches in the ILD layer for the interconnect elements in the first integrated circuit and the second integrated circuit and the plurality of pad segments of the segmented probe pad;
removing the interconnect trench etch mask;
forming a metal liner and a fill metal in the interconnect trenches and the via holes, the fill metal including copper, so as to form the interconnect elements in the first integrated circuit and the second integrated circuit and the plurality of pad segments of the segmented probe pad; and
removing the metal liner and the fill metal from a top surface of the ILD layer.

7. The method of claim 1, wherein:
the maximum lateral dimension of each instance of the plurality of pad segments is up to 25 percent of the probe pad structure width; and
the segmented probe pad is free of instances of metal interconnect elements of the interconnect level which have a maximum lateral dimension greater than 25 percent of the probe pad structure width.

8. The method of claim 1, further including the steps of:
forming a protective overcoat over the wafer, so that the protective overcoat has an opening which exposes the segmented probe pad; and
forming an unsegmented surface pad on each of the pad segments of the segmented probe pad.

9. The method of claim 1, wherein:
the plurality of pad segments includes a first plurality of large pad segments disposed in a central band of the segmented probe pad and a second plurality of small pad segments disposed in outer bands of the segmented probe pad; and
instances of the large pad segments have an area twice as large as an area of instances of the small pad segments.

10. The method of claim 1, wherein forming the unsegmented surface pad comprises:
forming a layer of surface pad metal over the protective overcoat layer including in the opening; and
performing a chemical-mechanical polish (CMP) operation to remove the layer of surface pad metal from over the protective overcoat layer leaving the layer of surface pad metal in the opening.

11. A semiconductor fabrication method comprising the steps of:
forming a dielectric layer over a wafer;
forming first elements of a first interconnect level of the wafer in the dielectric layer, wherein the first elements include first interconnect elements in a first integrated circuit of the wafer and a second integrated circuit of the wafer and an unsegmented probe pad of a probe pad structure in a saw lane of the wafer;
forming first vias in the dielectric layer in the first integrated circuit, in the second integrated circuit, and in the saw lane, the second integrated circuit being located adjacent to the first integrated circuit and the saw lane being located between and abutting the first integrated circuit and the second integrated circuit;
forming second elements of a second interconnect level of the wafer in the dielectric layer over the first vias, wherein the second elements include second interconnect elements in the first integrated circuit and the second integrated circuit and a first plurality of pad segments forming a first segmented probe pad of the probe pad structure in the saw lane;
forming second vias in the dielectric layer over the second elements in the first integrated circuit, in the second integrated circuit, and in the saw lane;
forming third elements of a third interconnect level of the wafer in the dielectric layer over the second vias, wherein the third elements include third interconnect elements in the first integrated circuit and the second integrated circuit and a second plurality of pad segments forming a second segmented probe pad of the probe pad structure in the saw lane;
forming a protective overcoat over the dielectric layer, so that the protective overcoat has an opening which exposes the second segmented probe pad; and
forming an unsegmented surface pad on the segmented probe pad, wherein:
the unsegmented surface pad, the second segmented probe pad, and the first segmented probe pad, and the unsegmented probe pad form one probe pad structure;
a width of the probe pad structure is defined as a widest lateral distance between edges of the first plurality of pad segments in the first segmented probe pad, in a direction perpendicular to a boundary of the first integrated circuit abutting the saw lane and a boundary of the second integrated circuit abutting the saw lane, adjacent to the probe pad;
a maximum lateral dimension of each instance of the first plurality of pad segments and the second plurality of pad segments less than 75 percent of the probe pad structure width; and the first segmented probe pad and second segmented probe pad are free of instances of metal interconnect elements which have a maximum lateral dimension greater than 75 percent of the probe pad structure width.

12. A method of fabricating an integrated circuit comprising the steps of:

forming a dielectric layer over a semiconductor wafer;

forming a probe pad structure in a saw lane between integrated circuit portions of the semiconductor wafer, the probe pad structure having a first vias in the dielectric layer, a first plurality of pad segments forming a first segmented probe pad in the dielectric layer over the first vias and an unsegmented surface pad covering the plurality of pad segments, the unsegmented surface pad being located in an opening of a protective overcoat layer.

13. The method of claim 12, wherein forming the unsegmented surface pad on the probe pad segments comprises:

forming the protective overcoat layer over the dielectric layer and first segmented probe pad;

forming the opening in the protective overcoat layer;

forming a layer of surface pad metal over the protective overcoat layer including in the opening; and performing a chemical-mechanical polish (CMP) operation to remove the layer of surface pad metal from over the protective overcoat layer leaving the layer of surface pad metal in the opening.

14. The method of claim 13, wherein forming the layer of surface pad metal comprises:

forming a first layer on the protective overcoat layer;

forming a layer of nickel on the first layer; and forming a layer of palladium on the layer of nickel.

15. The method of claim 12, further comprising forming an unsegmented probe pad of the probe pad structure in the dielectric layer below the segmented probe pad, so that the first vias connect between the unsegmented probe pad and the segmented probe pad.

16. The method of claim 15, further comprising:

forming second vias; and forming a second plurality of pad segments of a second segmented probe pad of the probe pad structure in the saw lane, wherein the second vias connect between the second segmented probe pad and the unsegmented probe pad and the first vias connect between the second segmented probe pad and the first segmented probe pad.

17. The method of claim 10, wherein forming the layer of surface pad metal comprises:

forming a first layer on the protective overcoat layer;

forming a layer of nickel on the first layer; and forming a layer of palladium on the layer of nickel.

* * * * *